United States Patent
Graef

(10) Patent No.: US 8,196,002 B2
(45) Date of Patent: Jun. 5, 2012

(54) SYSTEMS AND METHODS FOR JOINT LDPC ENCODING AND DECODING

(75) Inventor: Nils Graef, San Jose, CA (US)

(73) Assignee: Agere Systems Inc., Allentown, PA (US)

( * ) Notice: Subject to any disclaimer, the term of this patent is extended or adjusted under 35 U.S.C. 154(b) by 1404 days.

(21) Appl. No.: 11/756,709

(22) Filed: Jun. 1, 2007

(65) Prior Publication Data

US 2008/0301527 A1 Dec. 4, 2008

(51) Int. Cl.
*H03M 13/00* (2006.01)
(52) U.S. Cl. .............. 714/755; 714/780; 714/799
(58) Field of Classification Search ............ 714/752, 714/755, 780, 799
See application file for complete search history.

(56) References Cited

U.S. PATENT DOCUMENTS

| | | | |
|---|---|---|---|
| 5,278,846 A | 1/1994 | Okayama et al. |
| 5,325,402 A | 6/1994 | Ushirokawa |
| 5,392,299 A | 2/1995 | Rhines et al. |
| 5,513,192 A | 4/1996 | Janku et al. |
| 5,612,964 A | 3/1997 | Haraszti |
| 5,701,314 A | 12/1997 | Armstrong et al. |
| 5,717,706 A | 2/1998 | Ikeda |
| 5,844,945 A | 12/1998 | Nam et al. |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | McCallister et al. |
| 6,023,783 A | 2/2000 | Divsalar et al. |
| 6,029,264 A | 2/2000 | Kobayashi et al. |
| 6,041,432 A | 3/2000 | Ikeda |
| 6,097,764 A | 8/2000 | McCallister et al. |
| 6,216,251 B1 | 4/2001 | McGinn |
| 6,266,795 B1 | 7/2001 | Wei |
| 6,317,472 B1 | 11/2001 | Choi et al. |
| 6,351,832 B1 | 2/2002 | Wei |
| 6,377,610 B1 | 4/2002 | Hagenauer et al. |
| 6,438,717 B1 | 8/2002 | Butler et al. |
| 6,473,878 B1 | 10/2002 | Wei |
| 6,625,775 B1 | 9/2003 | Kim |
| 6,671,404 B1 | 12/2003 | Kawatani et al. |
| 6,748,034 B2 | 6/2004 | Hattori et al. |
| 6,757,862 B1 | 6/2004 | Marianetti |
| 6,788,654 B1 | 9/2004 | Hashimoto et al. |

(Continued)

FOREIGN PATENT DOCUMENTS

WO  WO 2006/016751  2/2006

(Continued)

OTHER PUBLICATIONS

Collins and Hizlan, "Determinate State Convolutional Codes" IEEE Transactions on Communications, Dec. 1993.

(Continued)

*Primary Examiner* — Esaw Abraham
(74) *Attorney, Agent, or Firm* — Hamilton DeSanctis & Cha

(57) ABSTRACT

Various embodiments of the present invention provide systems and methods for LDPC encoding and decoding. For example, a system for performing LDPC encoding and decoding is disclosed that includes a joint LDPC encoder/decoder. The joint LDPC encoder/decoder includes both an LDPC decoder and an LDPC encoder that each utilize a common LDPC decoder circuit to perform the respective functions of encoding and decoding.

20 Claims, 6 Drawing Sheets

U.S. PATENT DOCUMENTS

| | | | |
|---|---|---|---|
| 6,810,502 B2 | 10/2004 | Eidson | |
| 6,865,708 B2 * | 3/2005 | Wang | 714/758 |
| 6,986,098 B2 | 1/2006 | Poeppelman | |
| 7,010,051 B2 | 3/2006 | Murayama et al. | |
| 7,047,474 B2 | 5/2006 | Rhee et al. | |
| 7,058,873 B2 | 6/2006 | Song et al. | |
| 7,069,496 B2 * | 6/2006 | Fujita et al. | 714/780 |
| 7,093,179 B2 | 8/2006 | Shea | |
| 7,100,104 B2 * | 8/2006 | Yamamoto et al. | 714/786 |
| 7,184,486 B1 | 2/2007 | Wu et al. | |
| 7,191,376 B2 * | 3/2007 | Yedidia | 714/751 |
| 7,191,378 B2 | 3/2007 | Eroz et al. | |
| 7,203,887 B2 | 4/2007 | Eroz et al. | |
| 7,257,764 B2 | 8/2007 | Suzuki et al. | |
| 7,310,768 B2 | 12/2007 | Eidson et al. | |
| 7,415,079 B2 * | 8/2008 | Cameron et al. | 375/340 |
| 7,451,386 B2 * | 11/2008 | Shen et al. | 714/801 |
| 7,581,159 B2 * | 8/2009 | Hocevar | 714/790 |
| 7,631,246 B2 * | 12/2009 | Shen et al. | 714/774 |
| 7,721,187 B2 * | 5/2010 | Yen | 714/794 |
| 7,934,146 B2 * | 4/2011 | Stolpman | 714/800 |
| 2004/0098659 A1 | 5/2004 | Bjerke et al. | |
| 2005/0216819 A1 | 9/2005 | Chugg et al. | |
| 2005/0273688 A1 | 12/2005 | Argon | |
| 2006/0020872 A1 | 1/2006 | Richardson et al. | |
| 2006/0031737 A1 | 2/2006 | Chugg et al. | |
| 2006/0140311 A1 | 6/2006 | Ashley et al. | |
| 2006/0168493 A1 | 7/2006 | Song et al. | |
| 2006/0195772 A1 | 8/2006 | Graef et al. | |
| 2006/0248435 A1 | 11/2006 | Haratsch | |
| 2007/0047635 A1 | 3/2007 | Stojanovic et al. | |
| 2007/0286270 A1 | 12/2007 | Huang et al. | |
| 2008/0049825 A1 | 2/2008 | Chen et al. | |
| 2008/0168330 A1 | 7/2008 | Graef et al. | |

FOREIGN PATENT DOCUMENTS

| | | |
|---|---|---|
| WO | WO 2006/091797 | 8/2007 |

OTHER PUBLICATIONS

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes &Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC Techron, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong, "VLSI Architecture of LDPC Based Signal Detection and Coding System for Magnetic Recording Channel", Thesis, RPI, Troy, NY, pp. 1-95, May 2006.

Zhong, Hao et al., Joint Code-Encoder-Decoder Design for LDPC Coding System VLSI Implementation, Rensselaer Polytechnic Institute, printed Apr. 2007 from "www.ecse.rpi.edu".

Zhong, Hao et al., Block-LDPC: A Practical LDPC Coding System Design Approach, IEEE, Jul. 2004, printed Apr. 2007 from "www.ecse.rpi.edu".

Moon, Todd K., Error Correction Coding, 2005, pp. 640-649,, John K. Wiley & Sons Inc., Hoboken, NJ.

* cited by examiner

US 8,196,002 B2

SYSTEMS AND METHODS FOR JOINT LDPC ENCODING AND DECODING

BACKGROUND OF THE INVENTION

The present invention is related to systems and methods for encoding and decoding information, and more particularly to systems and methods for systematic block code encoding and decoding.

A number of encoding/decoding schemes have been developed to meet the needs for, among other things, data storage and data transmission. As one example, low-density parity-check (LDPC) codes have been developed that provide excellent error correcting performance using a highly parallelized decoding algorithm. However, while LDPC codes provide an appealing opportunity for applications demanding encoding and decoding functionality, the complexity of circuits implementing LDPC codes is often greater than the advantages of using LDPC codes. At least in part for this reason, encoding schemes relying on LDPC codes have found somewhat limited use.

Turning to FIG. 1, a typical transmission system 100 utilizing an LDPC encoder and a separate LDPC decoder is depicted. Transmission system 100 includes a transmission device 110 and a receiving device 160. Transmission device 110 includes an information source 120 that provides a stream of information to an LDPC encoder 130. LDPC encoder 130 encodes the received stream of information and provides an encoded data set to a transmitter 140. Transmitter 140 modulates the encoded data set to create a transmitted data set 150 that is provided to a receiver 190 of receiving device 160 via a channel 145. In various cases, errors are introduced to data set 150 by channel 145. Receiver 190 demodulates the encoded data set and provides it to an LDPC decoder 180 that decodes the encoded data set including an attempt to correct any introduced errors, and provides the decoded information as received information 170.

In general, the computational complexity required to encode using LDPC codes of system 100 is proportional to the square of the number of bits in the produced codeword. Thus, for codewords of any substantial length, the computational complexity involved in encoding and decoding using system 100 is prohibitive. Some approaches to LDPC encoding/decoding are realized such that computational complexity is more linear (i.e., computational complexity varies in proportion to the number of bits in the produced codeword). In such cases a dedicated encoder and a dedicated decoder are used. While this has reduced the computational complexity and made LDPC codes more attractive, the circuitry required to implement systems using such approaches is still substantial and in many cases prohibitive.

Hence, for at least the aforementioned reasons, there exists a need in the art for advanced systems and methods for encoding information and/or decoding encoded information.

BRIEF SUMMARY OF THE INVENTION

The present invention is related to systems and methods for encoding and decoding information, and more particularly to systems and methods for systematic block code encoding and decoding.

Various embodiments of the present invention provide systems and methods for LDPC encoding and decoding. For example, a system for performing LDPC encoding and decoding is disclosed that includes a joint LDPC encoder/decoder. The joint LDPC encoder/decoder includes both an LDPC decoder and an LDPC encoder that each utilize a common LDPC decoder circuit to perform the respective functions of encoding and decoding. In some instances of the aforementioned embodiment, the common LDPC decoder circuit is an iterative LDPC decoder circuit. In some cases, the iterative LDPC decoder circuit is operable to: receive a soft input, decode the soft input, and provide a decoded output. The decoded output is a hard output that includes a set of information bits and a set of redundancy bits. In such cases, the system may further include an encoder output and a decoder output. The encoder output includes both the set of information bits and the set of redundancy bits, and the decoder output includes only the set of information bits. In various instances of the aforementioned embodiments, the joint LDPC encoder/decoder is deployed in a cellular telephone, and in other instances the joint LDPC encoder/decoder is deployed in a hard disk drive system. In yet other instances of the aforementioned embodiments, the joint LDPC encoder/decoder is deployed in a 10-Gigabit Ethernet transceiver. Alternatively, the joint LDPC encoder/decoder is deployed in a broadband LAN such as, for example, a wireless LAN (i.e., WiFi) or WiMax.

In various instances of the aforementioned embodiments, the LDPC encoder further comprises a soft input converter. The soft input converter is operable to incorporate a set of redundancy bits with a set of received information bits, and to provide a soft output including the set of information bits and the set of redundancy bits. In some cases, the soft output indicates a high probability for the set of information bits and a low probability for the set of redundancy bits. In various cases, the LDPC decoder circuit includes an input port, and the soft output from the soft input converter and the soft input for decoding are provided to the LDPC decoder circuit via the same input port.

Other embodiments of the present invention provide methods for encoding/decoding information. Such methods include providing a joint LDPC encoder/decoder that has an LDPC decoder and an LDPC encoder. Both the LDPC encoder and the LDPC decoder utilize a common LDPC decoder circuit. The methods further include selecting either a decode operation or an encode operation. Where a decode operation is selected, a soft input is provided to the common LDPC decoder circuit, and the common LDPC decoder circuit provides a decoder output based at least in part on the soft input. Where an encode operation is selected, a soft input converter is used to incorporate redundancy bits with the information bits that are to be encoded. In some cases, the soft input converter provides a soft output that indicates a high probability of the information bits and a low probability for the redundancy bits. This soft output is provided to the common LDPC decoder circuit that in turn provides an encoder output based at least in part on the soft output.

Yet other embodiments of the present invention provide magnetic storage devices that include a joint LDPC encoder/decoder. The joint LDPC encoder/decoder includes an LDPC decoder and an LDPC encoder. Both the LDPC encoder and the LDPC decoder utilize a common LDPC decoder circuit. The magnetic storage devices further include a magnetic storage medium that is operable to receive encoded information from the joint LDPC encoder/decoder, and to provide information to the joint LDPC encoder/decoder. In some instances of the aforementioned embodiments, the LDPC encoder further includes a soft input converter. In such instances, the LDPC encoder is operable to receive a set of information bits, and the soft input converter is operable to incorporate a set of redundancy bits with the set of information bits and to provide a soft output including the set of information bits and the set of redundancy bits. In various instances, the aforementioned soft output indicates a high probability for the set of information bits and a low probability for the set of redundancy bits. In some instances, the soft output is provided to the LDPC decoder circuit via an input port, and an output of the LDPC decoder is written to the magnetic storage medium.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Figure 1:
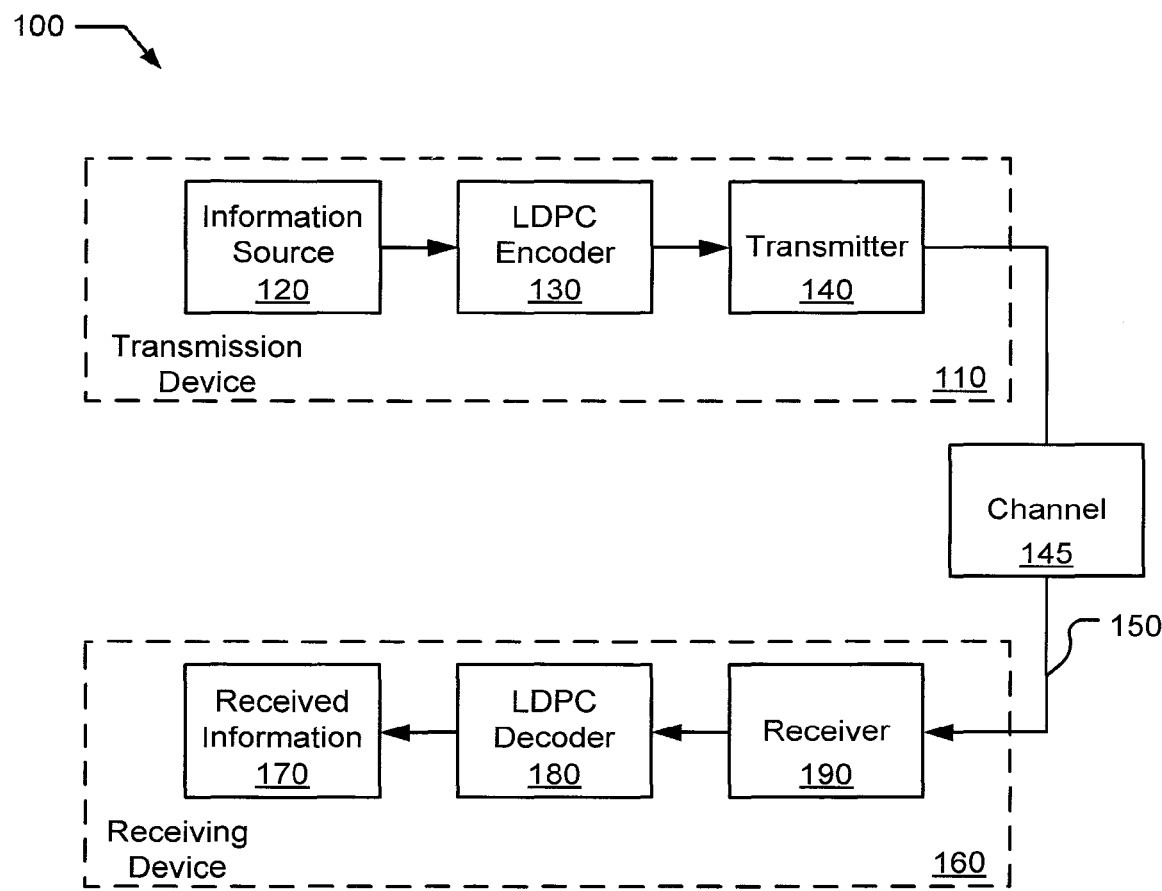
FIG. 1 is a prior art transmission system including an LDPC encoder and a separate LDPC decoder.

The present invention is related to systems and methods for encoding and decoding information, and more particularly to systems and methods for systematic block code encoding and decoding.

Various embodiments of the present invention provide systems and methods for LDPC encoding and decoding. For example, a system for performing LDPC encoding and decoding is disclosed that includes a joint LDPC encoder/decoder. As used herein, the phrase "joint LDPC encoder/decoder" is used in its broadest sense to mean any circuit, device or system that is capable of performing both LDPC encoding and LDPC decoding via a shared encoder and/or decoder element. Thus, in some instances of the aforementioned embodiments, the joint LDPC encoder/decoder includes both an LDPC decoder and an LDPC encoder that each utilize a common LDPC decoder circuit to perform the respective functions of encoding and decoding.

In some instances of the aforementioned embodiment, the common LDPC decoder circuit is an iterative LDPC decoder circuit. In some cases, the iterative LDPC decoder circuit is operable to: receive a soft input, decode the soft input, and provide a decoded output. As used herein, the phrases "soft output" or "soft input" are used in their broadest sense to mean respectively any output or input that includes probability or reliability information. Thus, for example, a soft input may include a number of bits that are each associated with a probability or reliability that the bit is correct. In such cases, a high probability or reliability indicates a more probable than not chance that the corresponding bit is correct. Similarly, a low probability or reliability indicates a more probable than not chance that the corresponding bit is incorrect. In one particular example, probability or reliability information is created using a log-likelihood ratio (LLR) which is the logarithm of the ratio of probabilities of a '0' being transmitted versus a '1' being transmitted for a received signal. The LLR for a bit 'b' is defined as:

$$L(b) = \log\left\{\frac{PR(b=0|r=\{x,y\})}{PR(b=1|r=\{x,y\})}\right\}.$$

The decoded output is a hard output that includes a set of information bits and a set of redundancy bits. In such cases, the system may further include an encoder output and a decoder output. The encoder output includes both the set of information bits and the set of redundancy bits, and the decoder output includes only the set of information bits. In various instances of the aforementioned embodiments, the joint LDPC encoder/decoder is deployed in a cellular telephone, and in other instances the joint LDPC encoder/decoder is deployed in a hard disk drive system. As used herein, the phrase "electrically coupled" is used in its broadest sense to mean any coupling whereby an electrical signal may be passed from one node to another. In some cases, the electrical coupling is a direct electrical coupling via a wire or some other direct connection. In other cases, the electrical coupling is an indirect electrical coupling via an intervening device. Thus, for example, two nodes may be electrically coupled via a wire or other electrical conductor, or by a multiplexer, an amplifier, or other device. Based on the disclosure provided herein, one of ordinary skill in the art will recognize a variety of approaches that may be used to electrically couple one node to another.

Figure 2A:
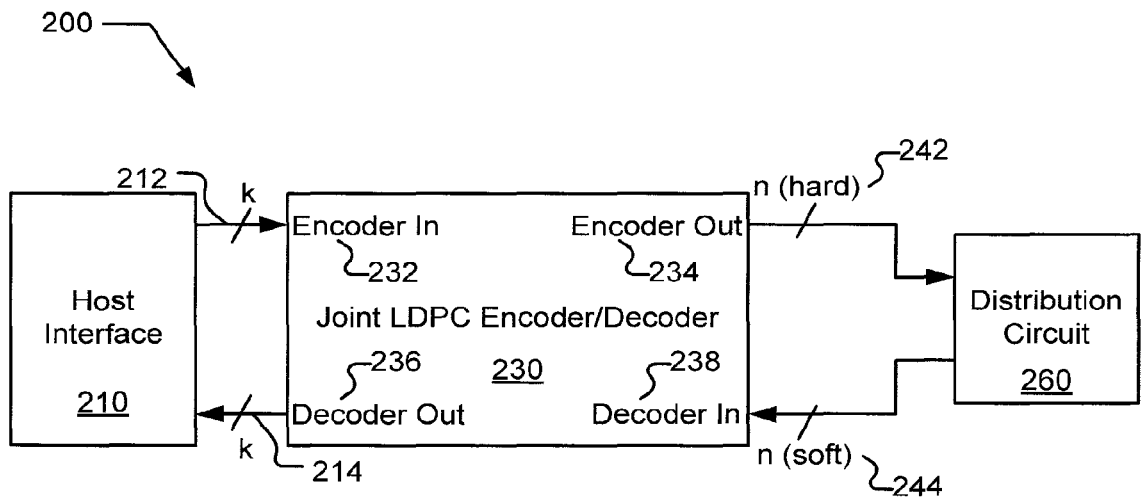
FIGS. 2a-2d depicts a system including a joint LDPC encoder/decoder in accordance with one or more embodiments of the invention.

Turning to FIG. 2a, a system 200 including a joint LDPC encoder/decoder in accordance with one or more embodiments of the invention is depicted. System 200 includes a host interface 210, a joint LDPC encoder/decoder 230, and a distribution circuit 260. Host interface 210 may be any circuit or device capable of providing information 212 to be encoded by joint LDPC encoder/decoder 230, and for receiving information 214 that was previously decoded by joint LDPC encoder/decoder 230. As shown, each of information 212 and information 214 is k-bits in length. These k-bits may be provided either in serial or parallel to/from host interface 210. In some embodiments of the present invention, host interface 210 is associated with a microprocessor of a device in which system 200 is imbedded. Based on the disclosure provided herein, one of ordinary skill in the art will recognize a variety of host interfaces and implementations thereof that may be used in relation with one or more embodiments of the present invention.

Distribution circuit 260 may be any circuit or device capable of receiving and distributing encoded information 242 from joint LDPC Encoder/Decoder 230, and capable of receiving encoded information possibly corrupted by noise 244 and providing the encoded information to joint LDPC Encoder/Decoder 230. Based on the disclosure provided herein, one of ordinary skill in the art will recognize a variety of distribution circuits 260 that may be used in relation to different embodiments of the present invention. For example, distribution circuit 260 may be, but is not limited to, a read channel in a magnetic storage device or a transmitter/receiver in a cellular telephone.

Joint LDPC encoder/decoder 230 includes an encoder input 232, a decoder input 238, an encoder output 234 and a decoder output 236. Joint LDPC encoder/decoder 230 receives information 212 (i.e., k-bits of hard information), encodes the information and provides the encoded information as n-bits of encoded information 242. Encoded information 242 is a hard output including bits corresponding to information 212 and redundancy bits (i.e., n-k redundancy bits) added in the encoding process. In addition, Joint LDPC encoder/decoder 230 receives encoded information possibly corrupted by noise 244 (i.e., an n-bit soft input), decodes the information, strips any redundancy bits and provides the decoded information as information 214 (i.e., k-bits of hard information). The process of encoding is done using substantially the same hardware as that used for the decoding process. In the abstract, this is accomplished by making information 212 appear the same as possibly corrupted information 244, and then applying the same decoding algorithm to "correct" redundancy bits added to information 212 that is to be encoded.

In some embodiments of the present invention, the decoding algorithm may perform a sum-product iterative decoding algorithm described in Moon, Todd K., "Error Correction Coding", section 15.5, John Wiley and Sons Inc., Hoboken, N.J., 2005. The entirety of the aforementioned reference is incorporated herein by reference for all purposes. However, based on the disclosure provided herein, one of ordinary skill in the art will recognize a variety of different decoding approaches that may be used in relation to one or more embodiments of the present invention. In particular, the decoding algorithm may be implemented using any decoder that is capable of receiving a soft input, and in turn providing a hard output.

Figure 2B:
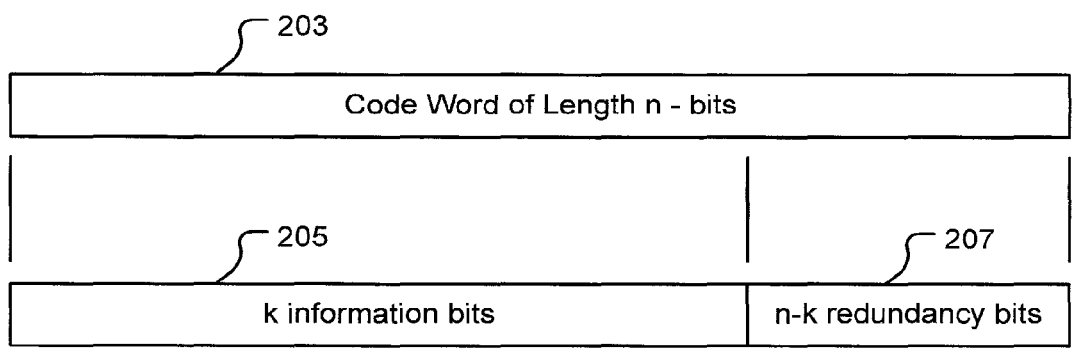

FIG. 2b shows the relation of the aforementioned k-bits (i.e., information bits) to an encoded soft information 203. Soft information 203 of length n-bits includes k information bits 205 and (n-k) redundancy bits 207. Soft information 203 generically represents both possibly corrupted information 244 that is to be decoded by joint LDPC encoder/decoder 230 and information 212 after being augmented by n-k redundancy bits. In the eases of encoding, redundancy bits 207 are added to information 212 by joint encoder/decoder 230. In the case of decoding, redundancy bits 207 are included in possibly corrupted information 244. In general, the decoding process uses redundancy bits 207 to properly decode information bits 205, and to correct errors therein introduced by, for example, noise. Once information bits 205 are decoded, redundancy bits 207 are removed from soft information 203 leaving information bits 205. As previously suggested, information bits 205 represent data that is originally received prior to encoding, and redundancy bits 207 represent bits that are added to information bits 205 during the encoding process.

Figures 2C, 2D:
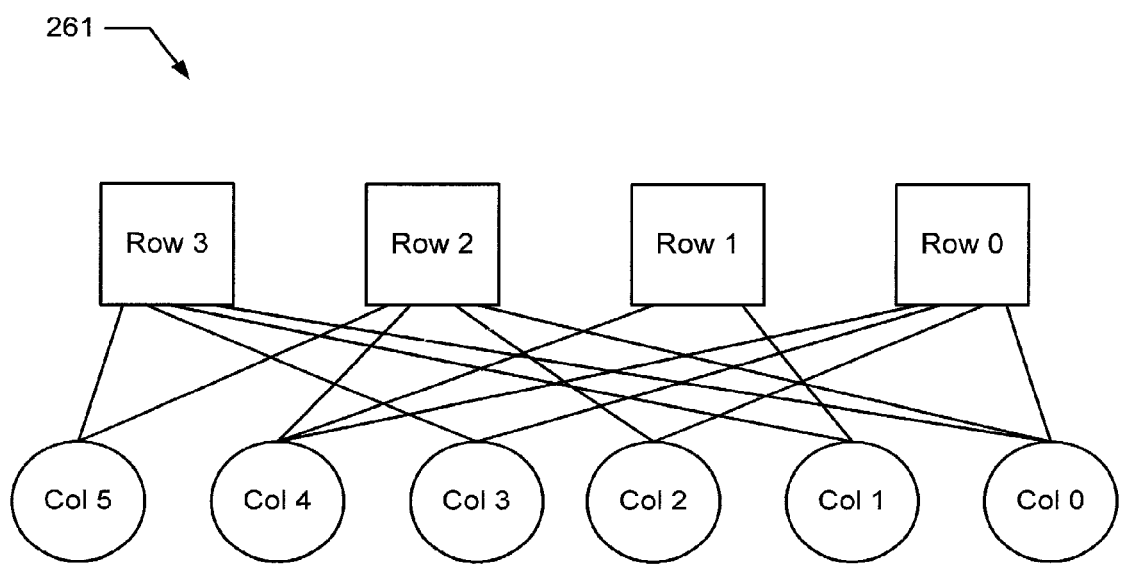

An example of a decoding process that may be used in relation to one or more embodiments of the present invention is discussed in relation to FIGS. 2b-2d. In this example, 'n' is six and 'n-k' is four, so 'k' is two. The received soft information consists of a number of probabilities not only indicating the particular binary value of the bits in the soft information, but also the probability that the particular bits have been correctly predicted. For this example, assume each of the bits is represented by a '1.0' where the bit is a one with a one hundred percent probability of being correct. When the probability is zero, the bit has a value of one half (i.e., 0.5). Other probabilities are linearly represented between one half and one (i.e., 0.5 to 1.0). The bits are represented by a zero when the bit is a zero with a one hundred percent likelihood of being correct, and a one half when the probability is zero. Again, other probabilities are linearly represented between negative one half to zero (i.e., 0.0 to 0.5).

In decoding soft information 203, a parity check matrix 211 is utilized. In the abstract, where the product of the codeword multiplied by matrix 211 is equal to zero, a correct codeword has been identified. Where the matrix multiplication does not yield a zero, one or more errors remain in soft information 203. Iterative LDPC decoding performs a process of iteratively modifying soft information 203 until the zero result is achieved, or at least until a result sufficiently close to zero is achieved. As the result of the iterative multiplication converges, increased confidence in the iteratively modified soft information 203 is achieved.

Where both encoding and decoding are done using substantially the same circuitry, matrix 211 is used for both the encoding and decoding processes. As will be appreciated by one of ordinary skill in the art, matrix 211 is merely exemplary and a number of encoding/decoding matrices may be used in accordance with the embodiments of the present invention depending upon a desired codeword length and implemented redundancy. Matrix 211 includes a number of columns 213 and a number of rows 215. The number of columns 213 corresponds to the length of soft information 203. Thus, in this case, soft information 203 is six bits in length. The number of rows 215 corresponds to the implemented redundancy applied to information bits 205. In particular, each of rows 215 corresponds to a different parity check that is built into soft information 203 by a preceding encoding process.

Matrix 211 may be represented by a Tanner diagram 261 that displays the relationship between the rows 215 and columns 213 of matrix 211. In particular, there is a circle for each column of matrix 211, and a square for each row of matrix 211. Where there is a binary '1' in matrix 211, it is represented by a path between the circle and square corresponding to location of the '1' in the matrix. Thus, where there is a '1' corresponding to the intersection of column five and row three, a path is drawn between the square representing row three and the circle representing column five. Alternatively, where there is not a '1' at the intersection column four and row three, no path is drawn between the square representing row three and the circle representing column 4. Tanner diagram 261 shows all of the paths corresponding to the row/column intersections in matrix 211.

Tanner diagram 261 provides an effective graphic for discussing the exemplary decoding algorithm. The exemplary algorithm begins by applying the probability value of each of the individual bits of soft information 203 to the circle corresponding to the respective bit. To illustrate, the following exemplary probability values for soft information 203 are used for soft_information[5 . . . 0] 203: 1.0, 0.9, 0.25, 0.33, 0.05 and 0.9. The value of 1.0 corresponding to bit 5 of soft information 203 is assigned to the circle corresponding to column 5; the value of 0.9 corresponding to bit 4 of soft information 203 is assigned to the circle corresponding to column 4; the value of 0.25 corresponding to bit 3 of soft information 203 is assigned to the circle corresponding to column 3; the value of 0.33 corresponding to bit 2 of soft information 203 is assigned to the circle corresponding to column 2; the value of 0.05 corresponding to bit 1 of soft information 203 is assigned to the circle corresponding to column 1; and the value of 0.9 corresponding to bit 0 of soft information 203 is assigned to the circle corresponding to column 0. These values are then applied to a formula implemented by each of the boxes corresponding to the respective rows. The formula may be any number of formulas as are known in the art. The value for each of the row results is then transferred back to each circle attached to the row via a path of Tanner diagram 261 where the various results are aggregated. Another iteration is then performed using the newly identified values in the circles and the process is repeated. This process continually accumulates the probability data. Where only a limited number of errors exist in soft information 203, over a number of iterations the values maintained in the circles corresponding to the respective columns represents the decoded codeword. Thus, assume the aforementioned process ends with the following decoded codeword: 1.0, 0.75, 0.20, 0.75, 0.05 and 1.0. In this case, the hard output corresponding to the decoded codeword would be: 1, 1, 0, 1, 0, 1. As previously stated, a correct codeword is found where matrix 211 multiplied by the hard output of LDPC decoder 220 is equivalent to zero. Thus, the decoding process may continue to iterate until a zero result is achieved, or at least until a result sufficiently close to zero is achieved.

During an encoding process, substantially the same process as described above as decoding is used. In particular, information 212 is received from host interface 210 and is augmented by joint LDPC encoder/decoder 230 with n-k redundancy bits. The resulting codeword is then represented by soft values to create a soft input similar to possibly corrupted information 244. The soft input is created from information 212 and the added redundancy bits by assigning the highest probability value to each of k-information bits 212, and the lowest possible probability to each of the added redundancy bits. Where, for example, k-information bits 212 are 1 0 1 0 1 0 and the preceding ten to negative ten value system is followed, the following soft input including redundancy bits is 1.0, 0.0, 1.0, 0.0, 1.0, 0.0, 0.5, 0.5, 0.5 and 0.5.

Once the aforementioned soft input is created, it is applied to the same circuitry used to perform the previously described decoding process. Thus, the same process that is used to decode possibly corrupted information 244 to provide information 214 is used to encode the newly created soft input. As the confidence in the added redundancy bits is very low relative to the original information bits 212, after a number of iterations of the decoding algorithm, the appropriate redundancy bits for the received information bits 212 are derived as the decoding process "corrects" the low probability n-k redundancy bits that were added to the high probability k information bits. After a preset number of iterations or after the product of multiplying the newly created codeword (i.e., the codeword including information 212 and the added redundancy bits) by matrix 211 is equal to zero, the codeword derived through the iteration process is provided as encoded information 242. Thus, in contrast to a standard encoding process, the redundancy bits are not generated or otherwise identified in a typical encoding process. Rather, the redundancy bits are originally applied as some default value and then corrected using the decoding process.

Based on the disclosure provided herein, one of ordinary skill in the art will recognize a variety of advantages that may be achieved by using substantially the same circuitry for decoding as is used for encoding. As just one of many examples, reuse of decoding and encoding circuitry provides an area efficient approach to performing both functions.

Figure 3:
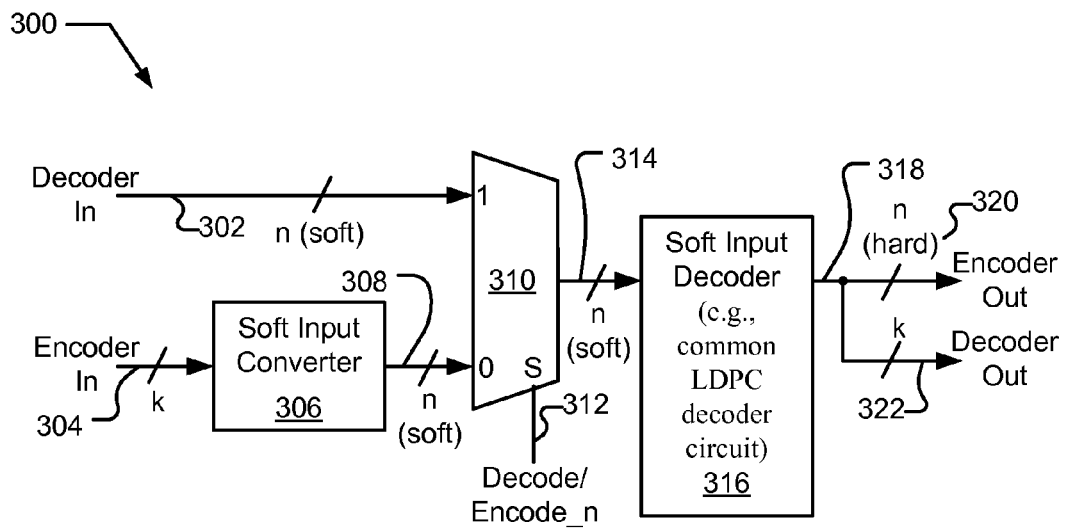
FIG. 3 shows a joint encoder/decoder in accordance with some embodiments of the invention.

Turning to FIG. 3, a joint encoder/decoder circuit 300 in accordance with various embodiments of the present invention is shown. Joint encoder/decoder 300 includes a decoder input 302 and an encoder input 304. Decoder input 302 receives an n-bit soft input that is provided to a multiplexer 310. Encoder input 304 receives a k-bit hard input that is converted to an n-bit soft input 308 by a soft input converter 306. Soft input 308 is applied to multiplexer 310. A selector input 312 determines whether soft input 302 or soft input 308 is provided as a soft output 314 from multiplexer 310. Soft output 314 is provided by multiplexer 310 to a soft input decoder 316 that implements a decoding algorithm that is capable of determining the appropriate hard output values 318 corresponding to soft output 314.

Soft input converter 306 may be any circuit or device that is capable of converting a k-bit hard input to an n-bit soft input. In one particular embodiment of the present invention, soft input converter 306 receives a k-bit input and assigns a high probability value to each bit of the k-bit hard input. In addition, soft input converter 306 incorporates a specified number of redundancy bits with the aforementioned k-bit input. Incorporating the redundancy bits with the k-bit input includes results in n-bit input 308. Each of the redundancy bits are assigned a probability that is less than that assigned to the k-bit input. In some embodiments of the present invention, assigning a high probability to each bit of the k-bit input includes assigning a more probable than fifty percent probability to each bit, and assigning a low probability to each of the redundancy bits includes assigning a less probable than fifty percent to each bit. In one particular embodiment of the present invention, assigning a high probability includes assigning the highest possible probability value for each bit polarity, and assigning a low probability includes assigning the lowest possible probability for each bit polarity.

Soft input decoder 316 may be any systematic block decoder that is capable of receiving a soft input, and providing a hard output corresponding to the soft input. In some embodiments of the present invention, soft input decoder 316 is an iterative LDPC decoder. Such an iterative LDPC decoder may be, but is not limited to, a sum-product iterative decoding algorithm described in Moon, Todd K., "Error Correction Coding", section 15.5, John Wiley and Sons Inc., Hoboken, N.J., 2005. Again, the entirety of the aforementioned reference is incorporated herein by reference for all purposes. Based on the disclosure provided herein, one of ordinary skill in the art will recognize a variety of different decoding approaches that may be used in relation to one or more embodiments of the present invention.

In operation when decoding is desired, selector 312 is asserted such that decoder input 302 is selected to drive soft output 314. Soft input decoder 316 then operates on soft output 314. After one or more iterations of soft input decoder 316, the correct bits corresponding to decoder input 302 are provided as an n-bit hard output 318. Where a decoder operation has been selected, any redundancy bits are stripped from n-bit hard output 318 to yield a k-bit decoded output 322.

In contrast, when encoding is desired, selector 312 is asserted such that soft input 308 is selected to drive soft output 314. By doing this, the first k values of soft input 308 are applied to the first k inputs of soft input decoder 316. The remaining n-k redundancy bit values are applied to the other soft inputs of soft input decoder 316. Soft input decoder 316 operates on the received probability values corresponding to soft input 308. Because the original information 304 to be encoded exhibits a relatively high probability compared to the added redundancy bits, the process of decoding operates to correct the arbitrarily selected redundancy bits. This process is continued until satisfactory redundancy bits are identified through the correction process. In the end, n-bit hard output 318 includes not only the correct original bits, but also correct redundancy bits. N-bit hard output 318 is then provided as an encoder output 320.

Depending on the number of iterations and the chosen decoding code, the aforementioned encoding process may not always determine all redundancy bits correctly. In such systems, one or more of the redundancy bits may be generated by a prior-art encoding algorithm. For example, the redundancy bit at position j (where j=k+1, ..., n) may be calculated by the vector-product of the k information bit-vector with the j-th column of the generator matrix of an LDPC code. In such systems, soft input converter 306 may be utilized to generate a subset of the redundancy bits by using a prior-art encoding algorithm, and map the resulting bit values onto the soft-input values indicating a high probability for the particular bit(s). This approach may be used for only a limited number of the added redundancy bits, and the remaining redundancy bits are arbitrarily assigned a low probability value.

Soft input decoder 316 either performs the same algorithm for decoding as was performed in the previously described decoding operation, or it performs a slightly modified decode process. The modified decode process includes updating the n-k redundancy bits, and leaving the original k-bits of information unmodified. By eliminating the possibility of modifying the original k-bits of information, only nodes that have a higher probability of being incorrect are allowed to change. In some cases, such a modified algorithm saves power and computation time, reduces latency, and increases the encoding throughput.

Figure 4:
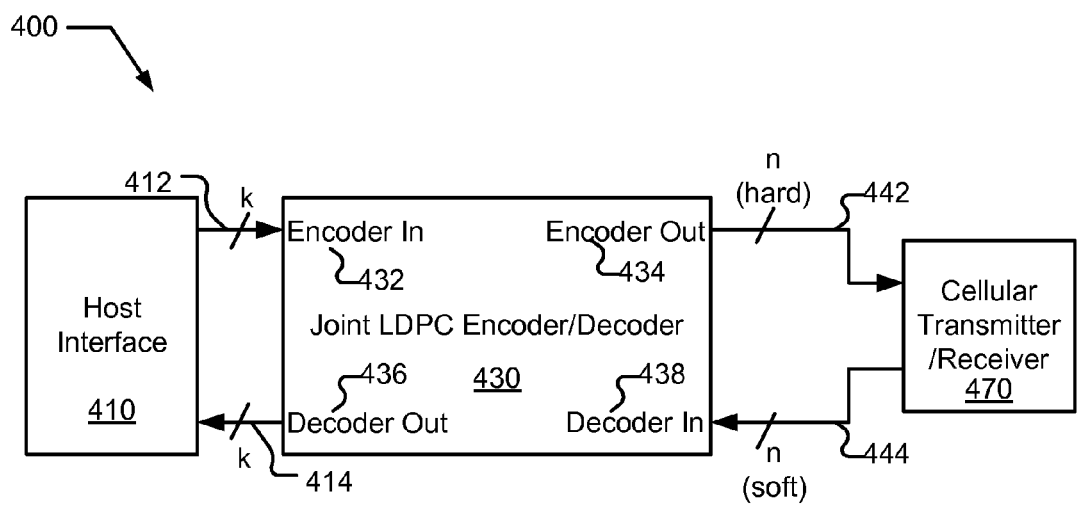
FIG. 4 depicts a cellular telephone including a joint LDPC encoder/decoder in accordance with various embodiments of the invention.

Turning to FIG. 4, a cellular telephone 400 including a joint LDPC encoder/decoder 430 in accordance with various embodiments of the invention is depicted. Cellular telephone 400 includes a host interface 410, joint LDPC encoder/decoder 430, and a cellular transmitter/receiver 470. Joint LDPC encoder/decoder 430 may be implemented similar to joint LDPC encoder/decoder 300 or joint LDPC encoder/decoder 230 as described above.

In operation, cellular transmitter/receiver 470 receives encoded information that is possibly corrupted by noise, and provides it as an n-bit soft decoder input 444 to joint LDPC encoder/decoder 430 via decoder input 438. Joint LDPC encoder/decoder 430 decodes the received soft input, and provides a k-bit hard output 414 via a decoder output 436. Host interface 410 receives and processes the decoded k-bit output 414. In contrast, non-encoded information 412 is provided from host interface 410 to an encoder input. Joint LDPC encoder/decoder 430 augments the k-bit input 412 to include redundancy bits and converts it to a soft output. This soft output is then "decoded" to correct the added redundancy bits as previously described. The output including the corrected redundancy bits is then provided as an n-bit hard output 442 via an encoder output 434 to cellular transmitter/receiver 470 where it is distributed.

Figure 5:
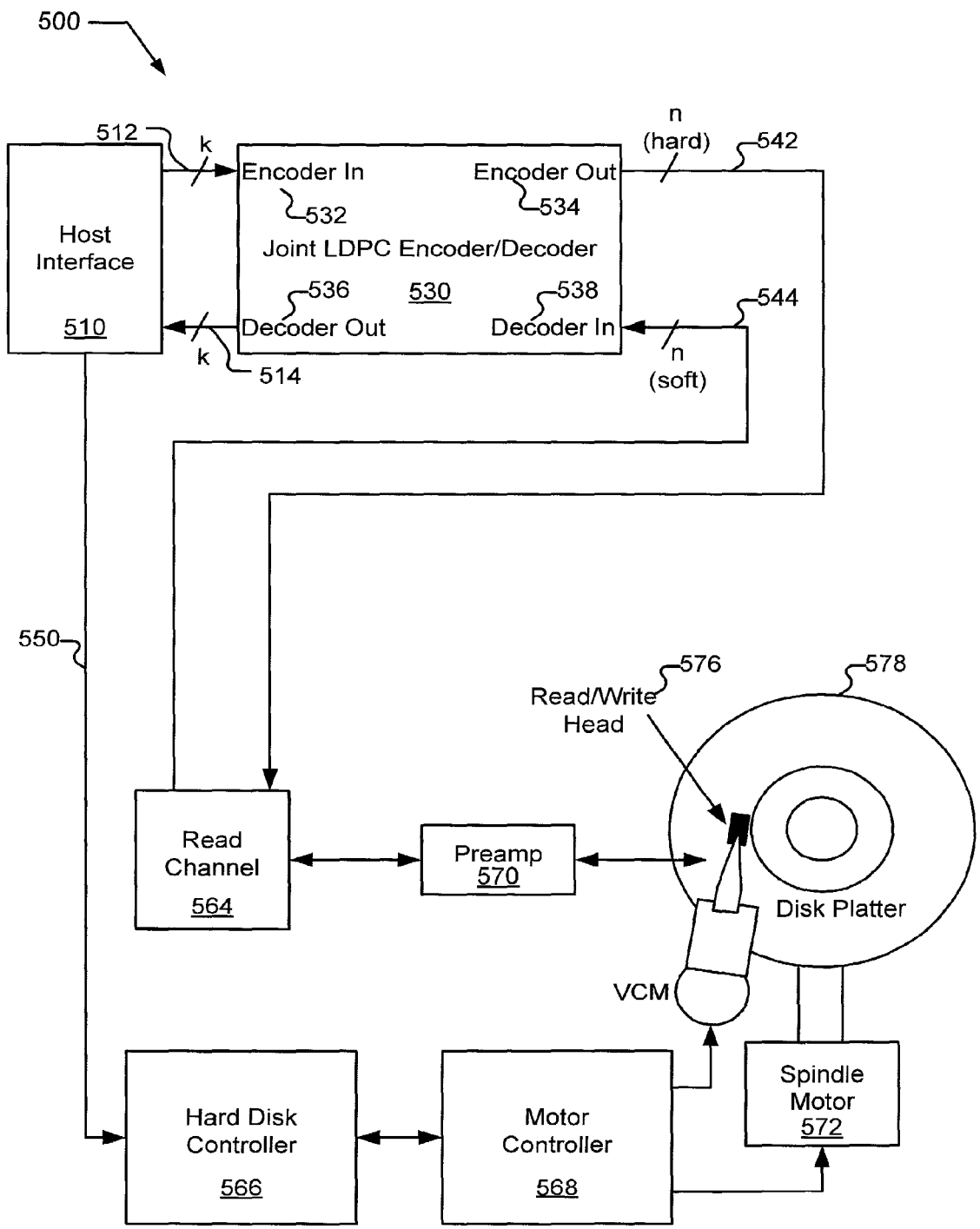
FIG. 5 depicts a hard disk drive system including a joint LDPC encoder/decoder in accordance with some embodiments of the invention.

Turning to FIG. 5, a hard disk drive system 500 including a joint LDPC encoder/decoder 530 in accordance with some embodiments of the invention is shown. Hard disk drive system 500 includes a host interface 510, joint LDPC encoder/decoder 530, and a hard disk drive 550. Joint LDPC encoder/decoder 530 may be implemented similar to joint LDPC encoder/decoder 300 or joint LDPC encoder/decoder 230 as described above.

Hard disk drive 550 may be any hard disk drive known in the art. As shown, hard disk drive 550 includes a read channel module 564, a preamp 570, a hard disk controller 566, a motor controller 568, a spindle motor 572, a disk platter 578, and a read/write head 576. The data on disk platter 578 consists of groups of magnetic signals that may be detected by read/write head assembly 576 when the assembly is properly positioned over disk platter 578. In a typical read operation, read/write head assembly 576 is accurately positioned by motor controller 568 over a desired data track on disk platter 578. Motor controller 568 both positions read/write head assembly 576 in relation to disk platter 578 and drives spindle motor 572 by moving read/write head assembly to the proper data track on disk platter 578 under the direction of hard disk controller 566. Spindle motor 572 spins disk platter 578 at a determined spin rate (RPMs).

Once read/write head assembly 578 is positioned adjacent the proper data track, magnetic signals representing data on disk platter 578 are sensed by read/write head assembly 576 as disk platter 578 is rotated by spindle motor 572. The sensed magnetic signals are provided as a continuous, minute analog signal representative of the magnetic data on disk platter 578. This minute analog signal is transferred from read/write head assembly 576 to read channel module 564 via preamp 570. Preamp 570 is operable to amplify the minute analog signals accessed from disk platter 578. In addition, preamp 570 is operable to amplify data from read channel module 564 that is destined to be written to disk platter 578. In turn, read channel module 564 digitizes the received analog signal to recreate a soft output 544 representing the encoded data read from disk platter 578. Joint LDPC encoder/decoder 530 decodes the received soft input 544, and provides a k-bit hard output 514 via a decoder output 536. Host interface 510 receives and processes the decoded k-bit output 514.

A write operation is substantially the opposite of the preceding read operation with non-encoded information 512 being received from host interface 510. Joint LDPC encoder/decoder 530 augments the k-bit input 512 to include redundancy bits and converts it to a soft output. This soft output is then "decoded" to correct the added redundancy bits as previously described. The output including the corrected redundancy bits is then provided as an n-bit hard output 542 via an encoder output 534 to read channel module 564. In addition, host interface 510 commands hard disk controller 566 to cause motor controller 568 and spindle motor 572 to move to the desired location on disk platter 578. In turn, read channel module 564 transfers the write data via preamp 570 and read/write head 576 to disk platter 578.

Figure 6:
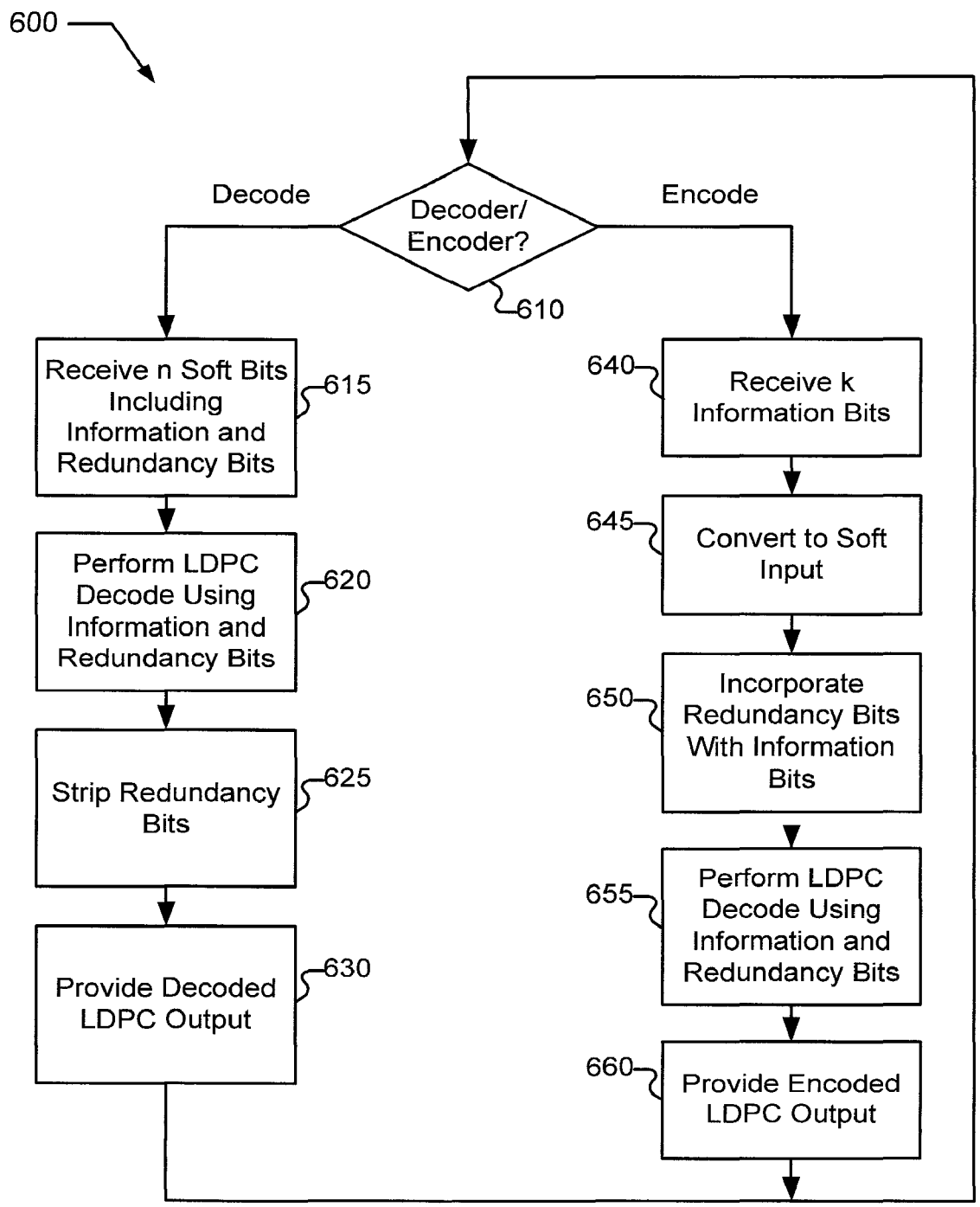
FIG. 6 is a flow diagram showing a method in accordance with various embodiments of the present invention for encoding and decoding information.

Turning to FIG. 6 a flow diagram 600 shows a method in accordance with various embodiments of the present invention for encoding and decoding information. Following flow diagram 600, it is determined whether a decode or encode operation is selected (block 610). Where a decode operation is selected (block 610), an n-bit soft input is received (block 615). The n-bit soft input includes both information and redundancy data. An LDPC decode is performed on the n-bit soft input to arrive at a hard output (block 620). The redundancy bits are stripped from the hard output leaving a k-bit information output (block 625). The k-bit hard output is then provided as a result of the decoding process.

Alternatively, where an encode process is selected (block 610), a non-encoded k-bit input is received (block 640). An n-bit soft output is created by assigning a high probability to each bit of the k-bit input (block 645) and incorporating one or more low probability redundancy bits with the k-bit input (block 650). An LDPC decode is then applied to the soft input to correct the redundancy bits (block 655). In some cases, this is exactly the same decoding algorithm as that applied during the decode scenario. In other cases, the decode algorithm is implemented on the same circuitry, but is truncated such that only nodes assigned to the redundancy bits are allowed to change. The encoded output including the corrected redundancy bits and original bits is provided as an output (block 660).

In conclusion, the invention provides novel systems, devices, methods and arrangements for encoding information and/or decoding encoded information. While detailed descriptions of one or more embodiments of the invention have been given above, various alternatives, modifications, and equivalents will be apparent to those skilled in the art without varying from the spirit of the invention. For example, embodiments of the present invention may be applied to other than systematic LDPC codes. Rather, embodiments of the present invention may also utilize LDPC encoders that can be represented by a concatenation of a systematic LDPC encoder followed by any interleaver. As another example, while the embodiments described above have been described in relation to iterative LDPC decoders only, other embodiments of the present invention may use other types of soft-input LDPC decoders. Indeed, the invention is not strictly limited to LDPC codes, but finds application to other systematic block codes. Further, it should be noted that embodiments of the present invention are not limited to half-duplex systems (e.g., magnetic or optical storage systems), but rather embodiments of the present invention may be used for full-duplex systems (e.g., 10-Gigabit Ethernet) by time-sharing the joint encoder/decoder hardware. Therefore, the above description should not be taken as limiting the scope of the invention, which is defined by the appended claims.

What is claimed is:

1. A system for performing data encoding and decoding, the system comprising:
   a joint LDPC encoder/decoder, wherein the joint LDPC encoder/decoder includes:
   an LDPC decoder;
   an LDPC encoder; and
   wherein both the LDPC encoder and the LDPC decoder utilize a common LDPC decoder circuit.

2. The system of claim 1, wherein the common LDPC decoder circuit is an iterative LDPC decoder circuit.

3. The system of claim 2, wherein the iterative LDPC decoder circuit is operable to:
   receive a soft input;
   decode the soft input; and
   provide a decoded output, wherein the decoded output is a hard output.

4. The system of claim 3, wherein the hard output includes a set of information bits and a set of redundancy bits, and wherein the system further comprises:
   an encoder output, wherein the encoder output includes both the set of information bits and the set of redundancy bits; and
   a decoder output, wherein the decoder output includes only the set of information bits.

5. The system of claim 1, wherein the LDPC encoder further comprises a soft input converter.

6. The system of claim 5, wherein the LDPC encoder is operable to receive a set of information bits; wherein the soft input converter is operable to incorporate a set of redundancy bits with the set of information bits; and wherein the soft input converter is operable to provide a soft output including the set of information bits and the set of redundancy bits.

7. The system of claim 6, wherein the soft output indicates a high probability for the set of information bits and a low probability for the set of redundancy bits.

8. The system of claim 6, wherein the LDPC decoder circuit includes an input port, and wherein the soft output and the soft input are provided to the LDPC decoder circuit via the input port.

9. The system of claim 1, wherein the joint LDPC encoder/decoder is deployed in a cellular telephone.

10. The system of claim 1, wherein the joint LDPC encoder/decoder is deployed in a hard disk drive system.

11. A method for encoding/decoding information, the method comprising:
    providing a joint LDPC encoder/decoder, wherein the joint LDPC encoder/decoder includes:
    an LDPC decoder;
    an LDPC encoder; and
    wherein both the LDPC encoder and the LDPC decoder utilize a common LDPC decoder circuit.

12. The method of claim 11, wherein the method further comprises:
    providing a soft input converter;
    selecting an encode operation, wherein a set of information bits are provided to the soft input converter, and wherein the soft input converter provides a soft output; and
    providing the soft output to the common LDPC decoder circuit, wherein the common LDPC decoder circuit provides an encoder output based at least in part on the soft output.

13. The method of claim 12, wherein the encoder output includes the set of information bits and a set of redundancy bits, and wherein the decoder output includes only the set of information bits.

14. The method of claim 12, wherein the soft output includes a set of redundancy bits incorporated with the set of information bits.

15. The method of claim 14, wherein the soft output indicates a high probability for the set of information bits and a low probability for the set of redundancy bits.

16. A magnetic storage device, the magnetic storage device comprising:
    a joint LDPC encoder/decoder, wherein the joint LDPC encoder/decoder is operable to perform as an LDPC decoder and an LDPC encoder utilizing a common LDPC decoder circuit.

17. The magnetic storage device of claim 16, wherein the LDPC encoder function is performed at least in part by a soft input converter, wherein the LDPC encoder is operable to receive a set of information bits, wherein the soft input converter is operable to incorporate a set of redundancy bits with the set of information bits, and wherein the soft input converter is operable to provide a soft output including the set of information bits and the set of redundancy bits.

18. The magnetic storage device of claim 17, wherein the soft output indicates a high probability for the set of information bits and a low probability for the set of redundancy bits.

19. The magnetic storage device of claim 17, wherein the soft output is provided to the LDPC decoder circuit via an input port, and wherein an output of the LDPC decoder is written to a magnetic storage medium.

20. The magnetic storage device of claim 19, wherein the set of redundancy bits is a first set of redundancy bits, wherein a data set accessed from the magnetic storage medium is provided to the LDPC decoder circuit, wherein the data set includes a second set of redundancy bits, and wherein the output of the LDPC storage circuit is stripped of the second set of redundancy bits.

* * * * *